United States Patent
Akahane

(10) Patent No.: US 12,477,661 B2
(45) Date of Patent: Nov. 18, 2025

(54) CHIP COMPONENT

(71) Applicant: KOA CORPORATION, Ina (JP)

(72) Inventor: Yasushi Akahane, Ina (JP)

(73) Assignee: KOA CORPORATION, Ina (JP)

( * ) Notice: Subject to any disclaimer, the term of this patent is extended or adjusted under 35 U.S.C. 154(b) by 344 days.

(21) Appl. No.: 18/266,722

(22) PCT Filed: Dec. 2, 2021

(86) PCT No.: PCT/JP2021/044273
§ 371 (c)(1),
(2) Date: Jun. 12, 2023

(87) PCT Pub. No.: WO2022/163120
PCT Pub. Date: Aug. 4, 2022

(65) Prior Publication Data
US 2024/0049399 A1    Feb. 8, 2024

(30) Foreign Application Priority Data

Jan. 29, 2021    (JP) .................................. 2021-013283

(51) Int. Cl.
*H05K 3/34* (2006.01)
*H01C 1/142* (2006.01)
(Continued)

(52) U.S. Cl.
CPC ........... *H05K 3/3431* (2013.01); *H01C 1/142* (2013.01); *H01C 7/003* (2013.01); *H01C 17/006* (2013.01); *H01C 17/283* (2013.01)

(58) Field of Classification Search
CPC ...... H01C 1/142; H01C 7/003; H01C 17/006; H01C 17/283; H05K 3/3431
See application file for complete search history.

(56) References Cited

U.S. PATENT DOCUMENTS 6,150,920 A    11/2000  Hashimoto et al.
6,359,546 B1 *  3/2002  Oh ....................... H01C 17/006
                                                    338/332
(Continued)

FOREIGN PATENT DOCUMENTS

JP    S59-61503 U    4/1984
JP    H10-223404 A   8/1998
(Continued)

OTHER PUBLICATIONS

Google Search printout. (Year: 2025).*
Feb. 22, 2022 International Search Report issued in International Patent Application No. PCT/JP2021/044273.

*Primary Examiner* — Kyung S Lee
(74) *Attorney, Agent, or Firm* — Oliff PLC

(57) ABSTRACT

A chip resistor according to the present invention includes an insulating substrate, a pair of back surface electrodes, a pair of top surface electrodes, a resistor, and a pair of end face electrodes. The back surface electrode includes the first electrode portion located inwardly and away from the end face of the insulating substrate, and the two second electrode portions arranged on two portions, respectively, in the short direction of the insulating substrate with the cutout portion, which is positioned between the end face of the insulating substrate and the first electrode portion, being interposed therebetween, and the maximum height of the first electrode portion is set to be more than the maximum height of the second electrode portions.

6 Claims, 6 Drawing Sheets

(51) Int. Cl.
*H01C 7/00* (2006.01)
*H01C 17/00* (2006.01)
*H01C 17/28* (2006.01)

(56) References Cited

U.S. PATENT DOCUMENTS

| | | | | |
|---|---|---|---|---|
| 6,703,683 | B2* | 3/2004 | Tanimura | H01C 17/281 |
| | | | | 257/536 |
| 6,982,624 | B2* | 1/2006 | Saito | H01C 17/006 |
| | | | | 338/332 |
| 7,782,174 | B2* | 8/2010 | Urano | H01C 1/142 |
| | | | | 338/307 |
| 9,997,281 | B2* | 6/2018 | Shinoura | H01C 17/006 |
| 2016/0247610 | A1 | 8/2016 | Shinoura et al. | |

FOREIGN PATENT DOCUMENTS

| | | |
|---|---|---|
| JP | 2013-074044 A | 4/2013 |
| JP | 2020-150273 A | 9/2020 |
| JP | 2020-170747 A | 10/2020 |

\* cited by examiner

CHIP COMPONENT

TECHNICAL FIELD

The present invention relates to a surface mount chip component to be soldered on lands of a circuit board.

BACKGROUND ART

A chip resistor, which is an exemplary chip component, commonly includes a rectangular parallelepiped insulating substrate, a pair of top surface electrodes provided at both ends, respectively, with a predetermined space interposed therebetween on the main (front) surface of the insulating substrate, a resistor provided so as to bridge between the pair of top surface electrodes, a protective film for covering the resistor, a pair of back surface electrodes provided at both ends, respectively, with a predetermined space interposed therebetween on the back surface of the insulating substrate, a pair of end face electrodes formed on both end faces of the insulating substrate, respectively, so as to bridge the top surface electrodes and the back surface electrodes, a pair of external electrodes formed by plating of the external surfaces of these end face electrodes, and the like.

The chip resistor having the structure as described above is surface-mounted with the back surface electrodes being placed on the lands provided on the circuit board and soldered. In the state where the chip resistor is surface-mounted as described above, when the thermal environment of the chip resistor repeatedly changes (hereinafter, referred to as "thermal shock"), a solder joint portion is easily damaged by the thermal stress, which may cause cracks to form. In the worst case, formation of cracks in the solder joint portion caused by the thermal shock may lead to conduction failure since the solder joint portion is a portion where the back surface electrodes of the chip resistor and the lands of the circuit board are electrically and mechanically connected.

In this regard, conventionally, as described in Patent Literature 1, a chip resistor of which back surface electrodes each includes the first electrode layer made of sintered silver and a second electrode layer made of sintered silver and laminated at a position off from the edge portions of the first electrode layer has been known. The chip resistor according to Patent Literature 1 is surface-mounted by soldering and joining the external electrodes that cover the back surface electrodes having the structure described above. In such a conventional chip resistor, steps are formed in portions extending from the side faces of the second electrode layer to the surface of the first electrode layer, and the step portions corresponding to these steps are also formed in the external electrode. Thus, the thickness of the solder joint portion increases by these step portions, whereby the thermal stress can be relieved.

CITATION LIST

Patent Literature

Patent Literature 1: JP-A-2013-74044

SUMMARY OF INVENTION

Technical Problem

In the chip resistor according to Patent Literature 1, relaxation of the thermal stress caused by the thermal shock is achieved by increasing the thickness of the solder in the step portions of the back surface electrode and using the flexibility of the solder. However, the hardness of solder (Young's modulus) varies depending on the composition of its solder material, and thus a joint portion of the chip resistor mounted using a high-strength solder is rigid due to its material. This may result in a problem that the heat stress caused by the thermal shock is transmitted to the back surface electrode without being absorbed by the solder portion, and thus the back surface electrode is peeled off from the insulating substrate.

The present invention has been made in view of the circumstances of the prior art described above, and an object of the present invention is to provide a chip component having high thermal shock resistance.

Solution to Problem

In order to achieve the object above, the present invention provides a chip component, comprising: a rectangular parallelepiped insulating substrate; a function element provided on a top surface of the insulating substrate; a pair of back surface electrodes made of a synthetic resin containing conductive particles, the back surface electrodes being formed to be thick films at both ends, respectively, in a longitudinal direction of a back surface of the insulating substrate; and a pair of end face electrodes for electrically connecting the function element and the back surface electrodes, the end face electrode being provided on both end faces, respectively, in the longitudinal direction of the insulating substrate, wherein each of the back surface electrodes includes a first electrode portion having a rectangular shape in plan view and a plurality of second electrode portions, the first electrode portion being located inwardly and away from the end face of the insulating substrate, and the second electrode portions being arranged on portions, respectively, which are separated in a short direction of the insulating substrate with a cutout portion, which is positioned between the end face of the insulating substrate and the first electrode portion, being interposed therebetween, and maximum height of the first electrode portion is set to be more than maximum height of the second electrode portions.

In the chip resistor having the structure described above, each of the back surface electrodes made of a resin material includes the first electrode portion having a rectangular shape in plan view, which is located inwardly and away from the end face of the insulating substrate, and the plurality of second electrode portions arranged on portions, respectively, which are separated in the short direction of the insulating substrate with the cutout portion, which is positioned between the end face of the insulating substrate and the first electrode portion, being interposed therebetween, and furthermore, the maximum height of the first electrode portion is set to be more than the maximum height of the second electrode portions. This allows the thermal stress caused by the thermal shock to be relaxed by the flexibility of the first electrode portion which is thick within the back side electrode even when it has been transmitted to the back surface electrode without being absorbed by the solder.

Preferably, in the structure described above, a cross-sectional shape of the first electrode portion along the longitudinal direction of the insulating substrate is arcuate, in which a central portion thereof is thicker than both ends. The first electrode portion having the arcuate shape as described above can be easily formed by applying resin paste, which is a material of the back surface electrodes, once and causing the surface tension.

In this case, the first electrode portion and second electrode portions of each of the back surface electrodes may be formed by printing and coating the resin paste in a plurality of times. However, it is preferable that each of the back surface electrodes has a single-layer structure in which the first electrode portion and the second electrode portions are formed by print-coating performed once.

In the structure describe above, the shape of each of the back surface electrodes in plan view may be a comb-tooth shape in which the cutout portions are interposed between three or more second electrode portions, respectively, however, it is preferable that each of the back surface electrodes has a channel shape in plan view, in which the first electrode portion and the two second electrode portions are formed consecutively so as to surround the cutout portion.

Advantageous Effects of Invention

According to the present invention, it is possible to provide a chip component having high thermal shock resistance.

DESCRIPTION OF EMBODIMENTS

Figure 1:
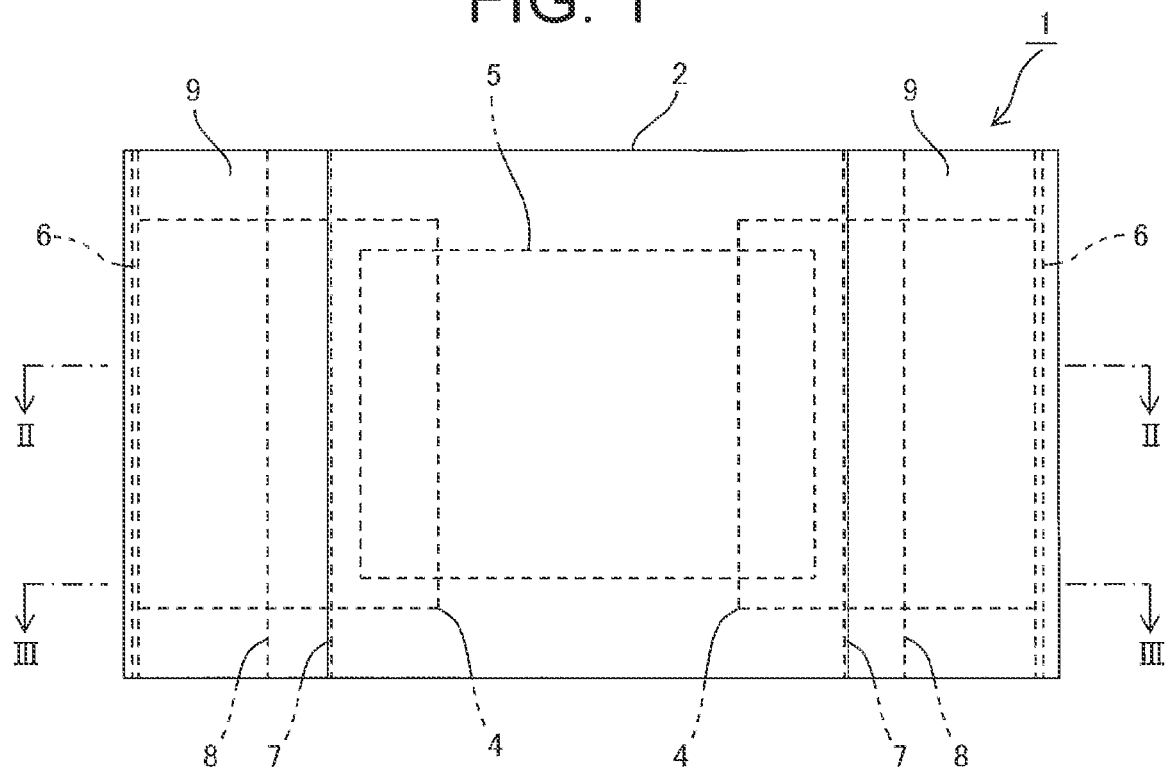
FIG. 1 is a top view of a chip resistor according to an embodiment of the present invention.

Hereinafter, an embodiment of the present invention will be described with reference to the drawings. FIG. 1 is a top view of a chip resistor according to an embodiment of the present invention, FIG. 2 is a cross-sectional view taken along the line II-II of FIG. 1, and FIG. 3 is a cross-sectional view taken along the line III-III of FIG. 1.

Figure 2:
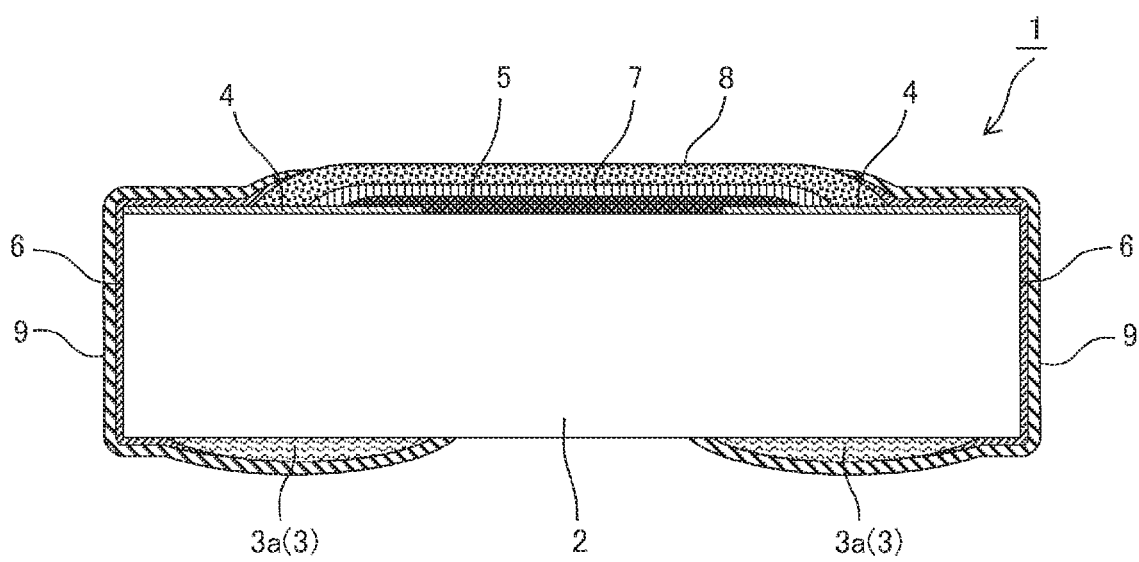
FIG. 2 is a cross-sectional view taken along the line II-II of FIG. 1.
Figure 3:
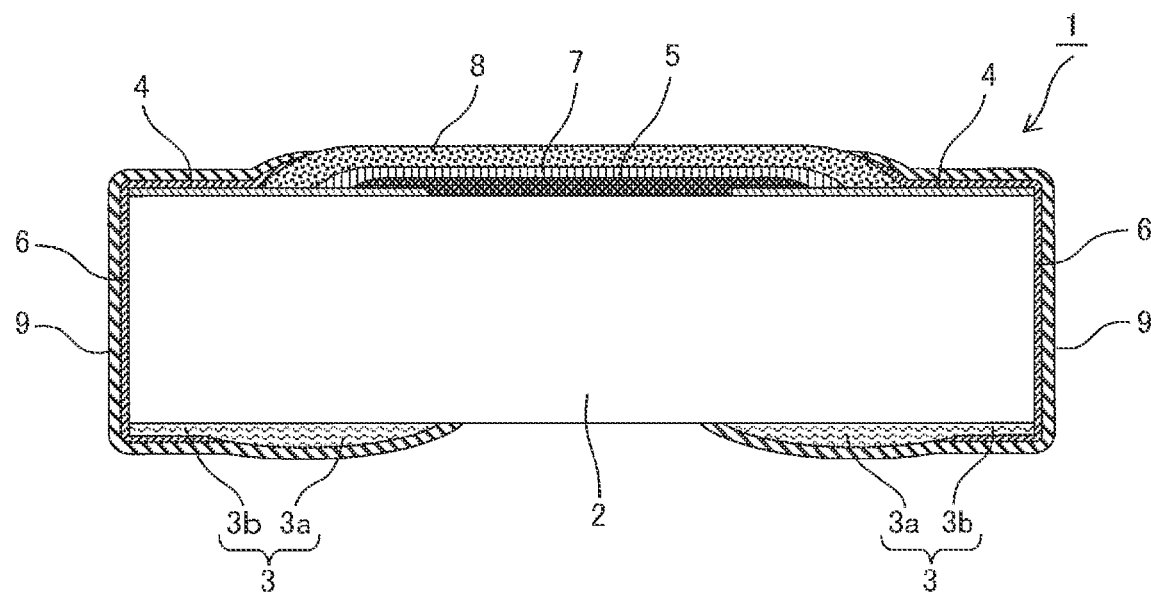
FIG. 3 is a cross-sectional view taken along the line III-III of FIG. 1.

As illustrated in FIG. 1 to FIG. 3, a chip resistor 1 as a chip component includes a rectangular parallelepiped insulating substrate 2, a pair of back surface electrodes 3 that is provided at both ends, respectively, in the longitudinal direction on the back surface (lower surface in FIG. 1) of the insulating substrate 2, a pair of top surface electrodes 4 that is provided at both ends, respectively, in the longitudinal direction on the top surface (upper surface in FIG. 1) of the insulating substrate 2, a resistor 5 that is provided on the top surface of the insulating substrate 2 such that both ends thereof overlap with the pair of top surface electrodes 4, a pair of end face electrodes 6 having a U-shape in cross section, which is provided on both end faces, respectively, in the longitudinal direction of the insulating substrate 2 to bridge between the back surface electrodes 3 and the top surface electrodes 4, a protective layer having a double-layer structure (undercoat layer 7 and overcoat layer 8), which covers the resistor 5, and a pair of external electrodes 9 having a double-layer structure (Ni plating layer and Sn plating layer), which is formed by plating on the external surfaces of the end face electrodes 6 and back surface electrodes 3.

The insulating substrate 2 is a ceramic substrate containing alumina as a main component, and is obtained by breaking (dividing) a large-sized substrate 20A (see FIG. 5 and FIG. 6), which will be described later, along division grooves extending to form a grid pattern.

The pair of back surface electrodes 3 is formed by screen-printing resin-paste containing conductive particles such as Ag, Ni, or carbon on the back surface of the large-sized substrate, and heating and curing the paste. The back surface electrode 3 includes a first electrode portion $3a$ having a rectangular shape in plan view, which is located inwardly and away from the end face of the insulating substrate 2, and second electrode portions $3b$ located between the end face of the insulating substrate 2 and the first electrode portion $3a$. The maximum height of the first electrode portion $3a$ is more than the maximum height of the second electrode portions $3b$. The back surface electrodes 3 will be described in detail later.

The pair of top surface electrodes 4 is obtained by screen-printing Ag paste on the top surface of the large-sized substrate and then drying and sintering the paste.

The resistor 5, which is a function element, is obtained by screen-printing resistor paste, such as ruthenium oxide, on the top surface of the large-sized substrate and then drying and sintering the paste. Both ends of the resistor 5 in the longitudinal direction overlap with the pair of top surface electrodes 4, respectively. Although not illustrated, a trimming groove for adjusting a resistance value is formed in the resistor 5.

The pair of end face electrodes 6 is formed by sputtering nickel (Ni)/chromium (Cr) or the like, and the top surface electrodes 3 and the back surface electrodes 3, which are spaced apart from each other with the end faces of the insulating substrate 2 interposed therebetween, are electrically connected to each other by these end face electrodes 6. Note that each of the end face electrodes 6 extends beyond the boundary position between the top surface electrode 4 and the overcoat layer 8 to the side edge of the overcoat layer 8, and the flat top surface of the overcoat layer 8 is exposed without being covered by the end face electrodes 6.

The double-layered protective film is formed of the undercoat layer 7 and overcoat layer 8. The undercoat 7 is obtained by screen-printing glass paste and then drying and sintering the paste, and is formed so as to cover the resistor 5 before being provided with a trimming groove. The overcoat layer 8 is obtained by screen-printing epoxy resin paste, and then heating and curing (baking) the paste, and is formed so as to cover the undercoat layer 7 after formation of the trimming groove.

Each of the pair of external electrodes 9 has a double-layer structure including a barrier layer and an external connection layer, and the barrier layer is an Ni plating layer formed by electroplating while the external connection layer is an Sn plating layer formed by electroplating. The external electrodes 9 are formed so as to cover the entire surfaces of the end face electrodes 6, and portions of the back surface electrodes 3 which are exposed from the end face electrodes 6.

Figure 4:
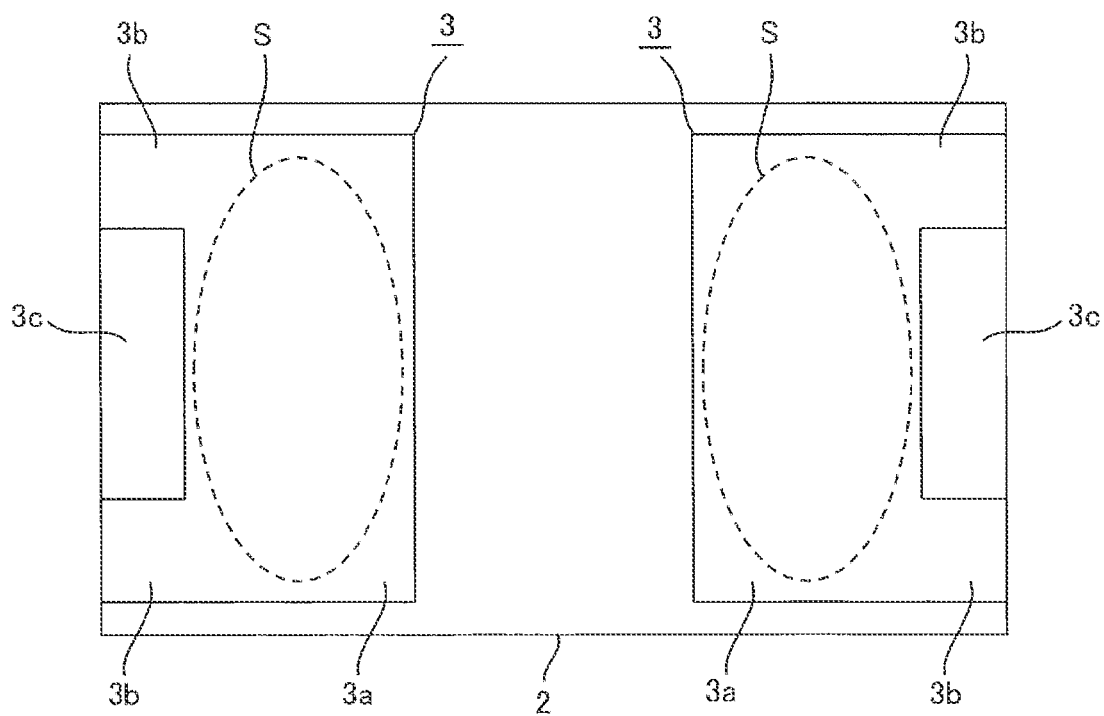
FIG. 4 is a diagram for explaining back surface electrodes provided in the chip resistor.

FIG. 4 is a diagram for explaining the back surface electrodes 3 formed on the back surface of the insulating substrate 2, in which the end face electrodes 6 and the external electrodes 9 are not illustrated in order to show the shape of the back surface electrodes 3 easily. As illustrated in FIG. 4, each of the back surface electrodes 3 is formed to have a channel shape (U-shape) in plan view, and includes the first electrode portion 3a and the two second electrode portions 3b. The first electrode portion 3a has a rectangular shape in plan view, and is located inwardly and away from the end face of the insulating substrate 2. The second electrode portions 3b are arranged on two portions, respectively, which are separated in the short direction of the insulating substrate 2 with a cutout portion 3c, which is positioned between the end face of the insulating substrate 2 and the first electrode portion 3a, being interposed therebetween. The cutout portion 3c is a non-coated portion on which the resin material of the back surface electrodes 3 is not printed, and the first electrode portion 3a and the two second electrode portions 3b are consecutively formed in a U-shape so as to surround the cutout portion 3c.

The cross-sectional shape of the portion surrounded by a dotted line S in the first electrode portion 3a is arcuate (semi-cylindrical shape), in which the thickness thereof in the height direction gradually increases from both ends to the center along the longitudinal direction of the insulating substrate 2. Forming the first electrode portion 3a into the arcuate shape as described above allows the maximum height of the first electrode portion 3a to be sufficiently more than that of the second electrode portions 3b. The first electrode portion 3a having the arcuate shape as described above can be easily formed by applying the resin paste, which is the material of the back surface electrodes 3, once and causing the surface tension.

Next, a method of producing the chip resistor 1 according to the present embodiment will be described with reference to FIG. 5 to FIG. 7. FIG. 5 and FIG. 6 are cross-sectional views illustrating the processes of producing the chip resistor 1, and FIG. 7 illustrates a flowchart of the production processes of the chip resistor 1.

Figure 6F:
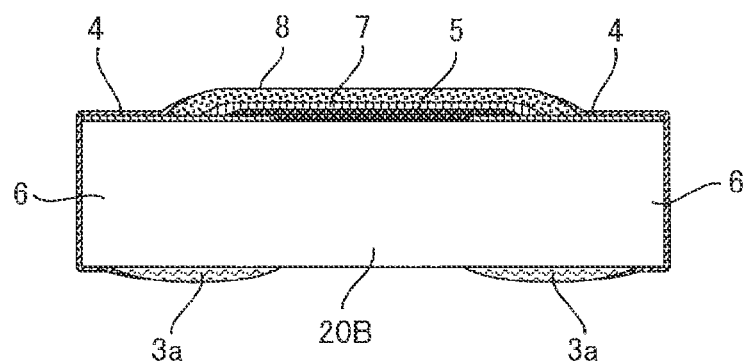
FIGS. 6F and 6G are a cross-sectional view illustrating the production processes of the chip resistor.
Figure 6G:
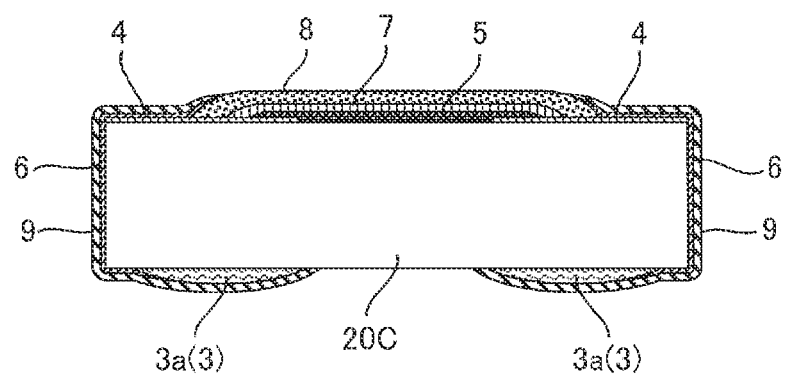
Figure 7:
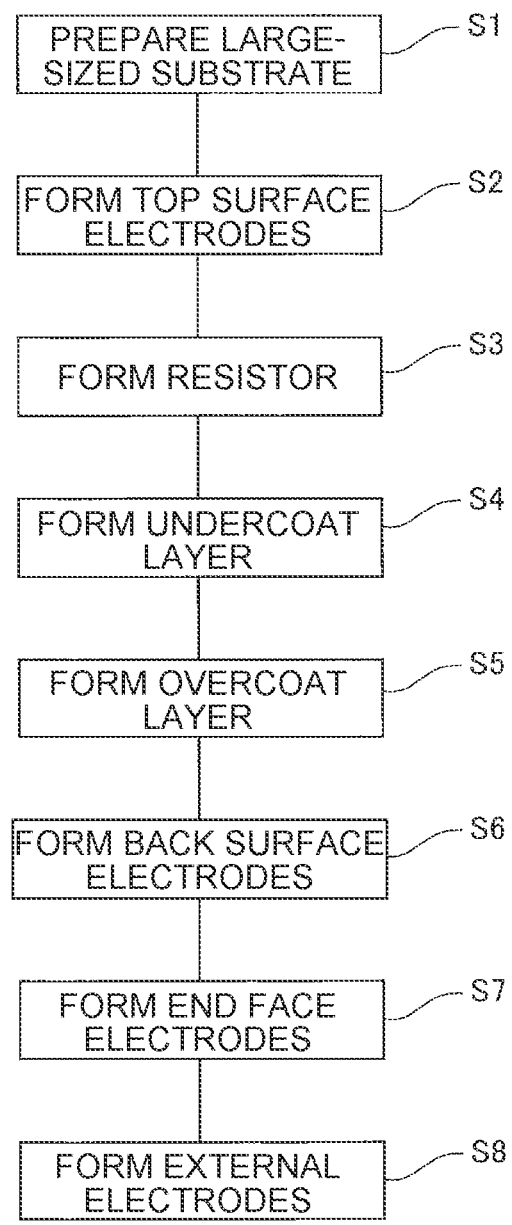
FIG. 7 illustrates a flowchart of the production processes of the chip resistor.

Firstly, as illustrated in step S1 of FIG. 7, a large-sized and sheet-shaped substrate 20A, from which a plurality of insulating substrates 2 is to be obtained, is prepared (large-sized substrate preparing process). The large-sized substrate 20A is provided with primary division grooves and secondary division grooves (both not illustrated) which extend to form a grid pattern, and each of the squares partitioned by these division grooves serves as one chip-forming area. Each of FIG. 5 and FIG. 6 illustrates the cross-sectional view of one chip-forming area, however, practically, processes to be described below are carried out collectively for the large-sized substrate 20A corresponding to a plurality of chip-forming areas.

Figure 5A:
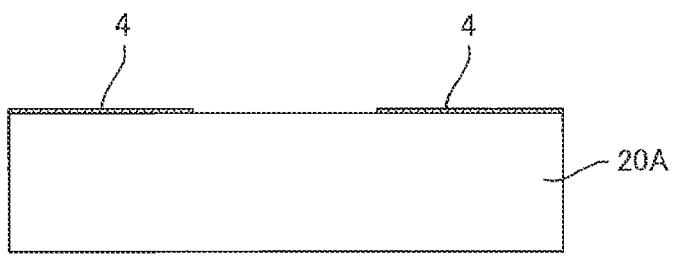
FIG. 5A to 5E are a cross-sectional view illustrating the production processes of the chip resistor.

That is, in step S2 of FIG. 7, as illustrated in FIG. 5(a), for forming, on the top surface of the large-sized substrate 20A, the top surface electrodes 4 facing each other across the chip-forming areas, the Ag paste is screen-printed in an area sandwiched between the secondary division grooves on the top surface of the large-sized substrate 20A so as to extend across each of the primary division grooves and then dried and sintered (top surface electrode forming process).

Figure 5B:
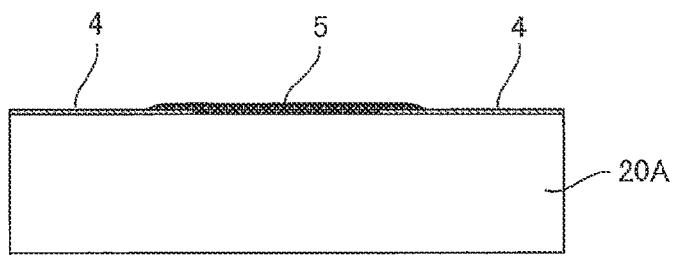

Next, in step S3 of FIG. 7, as illustrated in FIG. 5(b), for forming the resistor 5 that extends between the pair of top surface electrodes 4, the resistor paste such as ruthenium oxide is screen-printed on the top surface of the large-sized substrate 20A and then dried and sintered (resistor forming process).

Figure 5C:
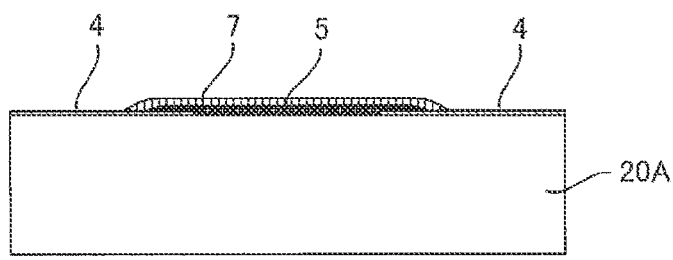

Next, in step S4 of FIG. 7, as illustrated in FIG. 5(c), for forming the undercoat layer 7 that covers the resistor 5, the glass paste is screen-printed and then dried and sintered (undercoat forming process). Then, a trimming groove (not illustrated) is formed in the resistor 5 from above the undercoat layer 7 to adjust a resistance value.

Figure 5D:
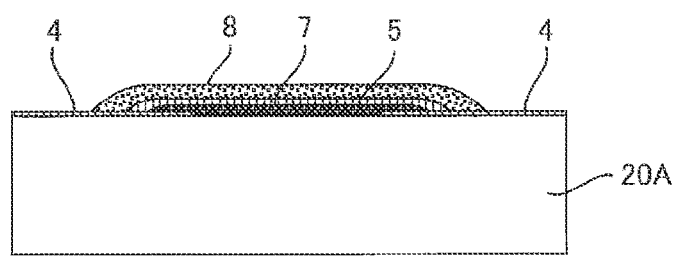

Next, in step S5 of FIG. 7, as illustrated in FIG. 5(d), for forming the overcoat layer 8 that covers portions of the top surface electrodes 4 and the entire of the resistor 5, the epoxy resin paste is screen-printed from above the undercoat layer 7 and then heated and cured (overcoat forming process). The protective layer having a double-layered structure for covering the resistor 5 is formed of these undercoat layer 7 and overcoat layer 8.

Figure 5E:
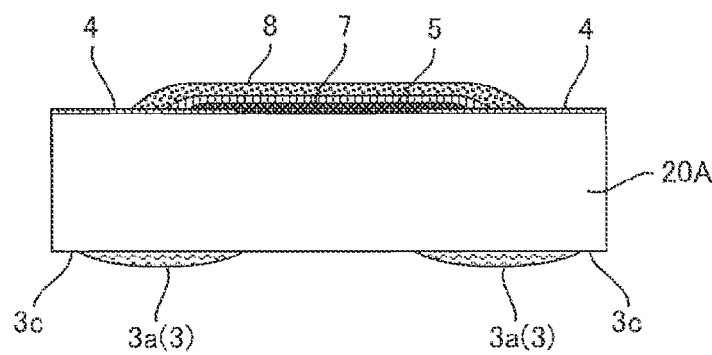

Next, in step S6 of FIG. 7, as illustrated in FIG. 5(e), for forming the back surface electrodes 3 facing each other with the primary division grooves therebetween at each chip forming area on the back surface of the large-sized substrate 20A, the resin paste containing conductive particles (for example, Ag) is screen-printed so as to extend across the primary division grooves in the region sandwiched between the secondary division grooves on the back surface of the large-sized substrate 20A, and then is heated and cured (back surface electrode forming step).

As illustrated in FIG. 4, each of the back surface electrodes 3 includes the first electrode portion 3a located inwardly at the chip forming region and away from the primary division groove, and the two second electrode portions 3b arranged along the secondary division groove with the cutout portion 3c, which is positioned between the primary division groove and the first electrode portion 3a, being interposed therebetween. Thus, the back surface electrodes 3, each of which has a channel shape (U-shape) in plan view, are formed at both ends, respectively, in the longitudinal direction of the chip forming region. That is, the cutout portion 3c is a non-coating portion on which the resin paste is not printed, and the two second electrode portions 3b extending in parallel to each other and the first electrode portion 3a are formed consecutively in a U-shape so as to surround the cutout portion 3c. In the back surface electrode 3 having the shape as described above, even with a single-layer structure obtained by applying the resin paste only once, the maximum height of the first electrode portion 3a is more than the maximum height of the second electrode portions 3b due to the surface tension of the resin paste.

The processes described above are carried out collectively for the large-sized substrate 20A. In the next process, the large-sized substrate 20A is divided by primary breaking (primary division) along the primary division grooves to obtain a strip-shaped substrate 20B. The cutout portion 3c, which is a portion where the resin paste is not applied, is formed between both the second electrode portions 3b of the back surface electrode 3, and this cutout portion 3c is located on the first division groove, which enhances the performance of breaking in the primary breaking of the large-sized substrate 20A.

Thereafter, in step S7 of FIG. 7, as illustrated in FIG. 6(f), for forming, on both end faces of the strip-shaped substrate 20B, the end face electrodes 6 that electrically connect between the top surface electrodes 4 and the back surface electrodes 3, Ni—Cr is applied on the divided faces of the strip-shaped substrate 20B by sputtering (end face electrode forming process). Each of the end face electrode 6 covers a portion of the back surface of the strip-shaped substrate 20B which is exposed from the cutout portion 3c, and also covers the second electrode portions 3b of the back surface electrode 3 excluding the first electrode portion 3a.

Next, the strip-shaped substrate 20B is divided by secondary breaking (secondary division) along the secondary division grooves to obtain a single chip 20C having the size equivalent to that of the chip resistor 1.

In the final process, as illustrated in FIG. 6(g), for forming the external electrodes 9 including a Ni plating layer and Sn plating layer on the entire surfaces of the end face electrodes 6 and the surfaces of the first electrode portions 3a, the single chip 20C obtained as a piece is electroplated (external electrode forming process). Thus, the chip resistor 1 as illustrated in FIG. 1 to FIG. 3 is obtained.

Figure 8:
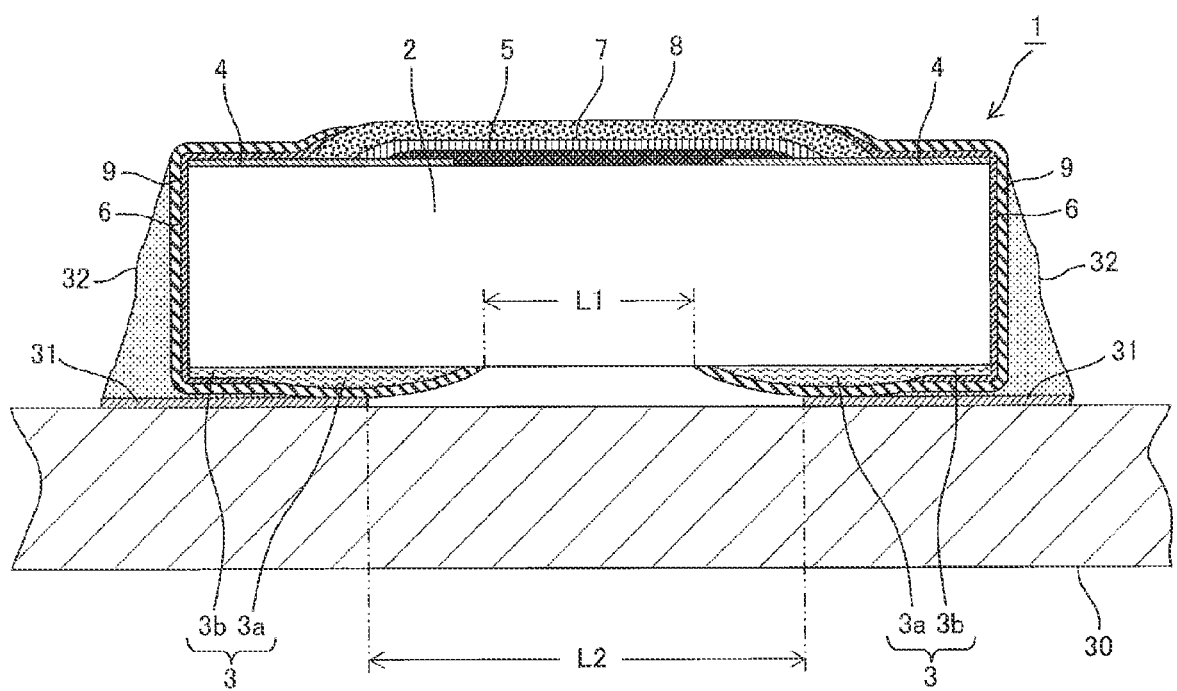
FIG. 8 illustrates a state in which the chip resistor is mounted.

FIG. 8 is a cross-sectional view of a state in which the chip resistor 1 thus produced is mounted. As illustrated in FIG. 8, the chip resistor 1 is mounted on lands 31 provided on a circuit board 30 with the back surface electrodes 3 facing downward, and is surface-mounted on the circuit board 30 by joining the pair of external electrodes 9 deposited on the end face electrodes 6 and back surface electrodes 3 to the corresponding lands 31, respectively.

In the component mounting structure according to the present embodiment, a separation distance L1 between the pair of external electrodes 9 on the back surface of the insulating substrate 2 is set to be shorter than a separation distance L2 between the pair of lands 31. In this structure, the central portion of the first electrode portion 3a which corresponds to a maximum thickness portion of the back surface electrode 3 is located substantially directly above the inner end of the corresponding land 31, and the portion which is at the inner side from the maximum thickness portion of the first electrode portion 3a protrudes inwardly from the corresponding land 31. With this structure, when bonding the chip resistor 1 to the lands 31 of the circuit board 30 using solder, the molten solder is received by the thick portion of the first electrode portion 3a, and thus prevented from extending up to the inner end of the back surface electrode 3 located farther inward than the inner end portion of the land 31. As described above, in the present embodiment, the thick portion of the first electrode portion 3a is made positioned at the inner end portion of the land 31 where the thermal stress caused by the thermal shock concentrates, whereby the thermal stress can be absorbed by the flexibility of the thick portion of the first electrode portion 3a made of a resin material. This enables reliable prevention of peeling off of the back surface electrodes from the insulating substrate, which may be caused by the thermal stress of the thermal shock even in soldering using a high-strength solder with large Young's modulus.

As described above, in the chip resistor 1 according to the present embodiment, each of the back surface electrodes 3 made of a resin material containing conductive particles includes the first electrode portion 3a having a rectangular shape in plan view, which is located inwardly and away from the end face of the insulating substrate 2, and the two second electrode portions 3b arranged on two portions, respectively, which are separated in the short direction of the insulating substrate 2 with the cutout portion 3c, which is positioned between the end face of the insulating substrate 2 and the first electrode portion 3a, being interposed therebetween, and thus each of the back surface electrodes is formed into a channel shape (U-shape) as a whole. Furthermore, the maximum height of the first electrode portion 3a is set to be more than the maximum height of the second electrode portions 3b. The structure described above allows the thermal stress caused by the thermal shock to be relaxed by the flexibility of the first electrode portion 3a which is thick within the back side electrode 3 even when it has been transmitted to the back surface electrode 3 without being absorbed by solder 32.

Furthermore, the cutout portion 3c consecutive to the end face of the insulating substrate 2 is located between the two second electrode portions 3b, whereby, in the process of obtaining a plurality of chip resistors 1 from the large-sized substrate 20A, the performance of breaking when the primary-breaking the large-sized substrate 20A along the primary division groove to obtain the strip-shaped substrate 20B can be enhanced.

Still further, in the mounting structure of the chip resistor 1 according to the present embodiment, the chip resistor 1 having the structure described above is mounted with the pair of back surface electrodes 3 facing downward and placed on the pair of lands 31 provided on the circuit board 30, and the pair of external electrodes 9 deposited on the end face electrodes 6 and the back surface electrodes 3 are connected to the corresponding lands 31, respectively, via the solder 32. In this state, a portion of the first electrode portion 3a of each of the back surface electrodes 3 protrudes inwardly from the corresponding land 31, and thus the molten solder is received by the thick portion of the first electrode portion 3a and cannot extend toward the inner end portion of the back surface electrode 3. As described above, the thick portion of the first electrode portion 3a is made positioned at the inner end portion of the land 31 where the thermal stress caused by the thermal shock concentrates, whereby the thermal stress can be absorbed by the flexibility of the thick portion of the first electrode portion 3a made of a resin material. This enables reliable prevention of peeling off of the back surface electrodes 3 from the insulating substrate 2, which may be caused by the thermal stress of the thermal shock even in soldering using a high-strength solder as the solder 32.

In the embodiment described above, each of the back surface electrodes 3 has a channel shape (U-shape), in which the first electrode portion 3a and the two second electrode portions 3b are formed consecutively so as to surround the cutout portion 3c. On the other hand, the shape of the back electrodes 3 in plan view is not limited thereto, and they may be formed into a comb-tooth shape in which the cutout portions 3c are interposed between three or more second electrode portions 3b, respectively.

In the embodiment described above, the chip resistor having a resistor as a function element, to which the present invention has been applied, has been described. On the other hand, the present invention is also applicable to a function element other than the resistor, for example, a chip component having an inductor, a capacitor, or the like.

REFERENCE SIGNS LIST 1 chip resistor (chip component)
2 insulating substrate
3 back surface electrode
3a first electrode portion
3b second electrode portion
3c cutout portion
4 top surface electrode
5 resistor (function element)
6 end face electrode
7 undercoat layer
8 overcoat layer
9 external electrode
20A large-sized substrate
20B strip-shaped substrate
20C single chip
30 circuit board
31 land
32 solder

The invention claimed is:

1. A chip component, comprising:
a rectangular parallelepiped insulating substrate;
a function element provided on a top surface of the insulating substrate;
a pair of back surface electrodes made of a synthetic resin containing conductive particles, the back surface electrodes being formed to be thick films at both ends, respectively, in a longitudinal direction of a back surface of the insulating substrate; and
a pair of end face electrodes for electrically connecting the function element and the back surface electrodes, the end face electrode being provided on both end faces, respectively, in the longitudinal direction of the insulating substrate, wherein
each of the back surface electrodes includes a first electrode portion having a rectangular shape in plan view and a plurality of second electrode portions, the first electrode portion being located inwardly and away from the end face of the insulating substrate, and the second electrode portions being arranged on portions, respectively, which are separated in a short direction of the insulating substrate with a cutout portion, which is positioned between the end face of the insulating substrate and the first electrode portion, being interposed therebetween, and
maximum height of the first electrode portion is set to be more than maximum height of the second electrode portions.

2. The chip component according to claim 1, wherein
a cross-sectional shape of the first electrode portion along the longitudinal direction of the insulating substrate is accurate, in which a central portion thereof is thicker than both ends.

3. The chip component according to claim 2, wherein
each of the back surface electrodes has a single-layer structure in which the first electrode portion and the second electrode portions are formed by print-coating performed once.

4. The chip component according to claim 3, wherein
each of the back surface electrodes has a channel shape in plan view, in which the first electrode portion and the two second electrode portions are formed consecutively so as to surround the cutout portion.

5. The chip component according to claim 2, wherein
each of the back surface electrodes has a channel shape in plan view, in which the first electrode portion and the two second electrode portions are formed consecutively so as to surround the cutout portion.

6. The chip component according to claim 1, wherein
each of the back surface electrodes has a channel shape in plan view, in which the first electrode portion and the two second electrode portions are formed consecutively so as to surround the cutout portion.

* * * * *